United States Patent [19]

Ishizuka et al.

[11] Patent Number: 4,531,089
[45] Date of Patent: Jul. 23, 1985

[54] ELECTRIC POWER DETECTING CIRCUIT AND GAIN CONTROL CIRCUIT USING THE SAME

[75] Inventors: Kohei Ishizuka; Yasuhiro Kita, both of Hachioji; Narimichi Maeda, Tachikawa, all of Japan; Masahiro Koya, Mountain View, Calif.; Kazuhiko Takaoka, Tokyo; Yoshiro Kokuryo, Kodaira, both of Japan

[73] Assignees: Hitachi, Ltd.; Hitachi Denshi Kabushiki Kaisha, both of Tokyo, Japan

[21] Appl. No.: 348,013

[22] Filed: Feb. 11, 1982

[30] Foreign Application Priority Data

Feb. 20, 1981 [JP] Japan .................................. 56-23110

[51] Int. Cl.³ ...................... G01R 17/06; G01R 1/30; G01R 21/00
[52] U.S. Cl. .............................. 324/99 D; 324/123 R; 364/483
[58] Field of Search ................. 324/99 D, 123 R, 142, 324/132; 364/483

[56] References Cited

U.S. PATENT DOCUMENTS 3,159,787  12/1964  Sexton et al. ................... 324/123 R Primary Examiner—Ernest F. Karlsen
Attorney, Agent, or Firm—Antonelli, Terry & Wands

[57] ABSTRACT

In a gain control circuit, an electric power calculating circuit is connected to a variable gain amplifier and a gain setting circuit for generating a gain control signal applied to the variable gain amplifier to control the gain thereof.

7 Claims, 7 Drawing Figures

ELECTRIC POWER DETECTING CIRCUIT AND GAIN CONTROL CIRCUIT USING THE SAME

BACKGROUND OF THE INVENTION

1. Field of the Invention

This invention relates to an electric power detecting circuit and a gain control circuit using the same. More particularly, this invention relates to the construction of a circuit which measures the level of input electric power of an input amplifier of a modem in a communication system for setting up the modem and also for attaining automatic gain control of the input amplifier.

2. Description of the Prior Art

In an apparatus such as a modem incorporated in a data transmission system, its automatic gain control circuit is required to follow the level of input electric power or the operation of the modem is controlled depending on the level of input electric power. In such an apparatus, it is necessary to accurately and quickly detect the electric power level of the input signal so that the input signal level can be controlled to be constant.

Especially, when an analogue input signal is passed through a variable gain amplifier and is then converted into a digital signal to be processed subsequently by a digital signal processing circuit, it is necessary that the digital signal has a stable and accurate digital level.

A gain control circuit which meets the above requirement is proposed in Japanese Patent Application Laid-open No. 55-97714 entitled "HYBRID GAIN CONTROL CIRCUIT" and laid open on July 25, 1980. The proposed gain control circuit is composed of an analogue gain control part making rough gain control and a digital gain control part making fine gain control, and the output of the gain control circuit is used to control the analogue and digital gain control parts.

However, the hybrid gain control circuit proposed in the above application is complex in structure due to the fact that it is composed of the analogue gain control part and digital gain control part. Further, the manner of control in the analogue gain control part making rough gain control in the proposed circuit is such that the gain of the variable gain amplifier is controlled on the basis of the level of the signal indicative of the difference between the amplifier output level and a predetermined reference level. Consequently, a variation in the level of the input signal leads to such a problem that a certain length of time is required until the amplification degree of the analogue gain control part is stabilized to be maintained constant.

SUMMARY OF THE INVENTION

It is therefore an object of the present invention to provide a novel and improved automatic gain control circuit in which the output of the variable gain amplifier is quickly stabilized at a predetermined output level irrespective of the level of its input signal.

Another object of the present invention is to provide an electric power detecting circuit which is required in a circuit such as the automatic gain control circuit described above, for detecting electric power of a very weak input signal.

The present invention which attains the above objects is featured by the fact that the output electric power of the variable gain amplifier and the gain of the variable gain amplifier are represented in decibel, and the latter is subtracted from the former to detect the electric power of the input signal so as to control the gain of the amplifier on the basis of the detected electric power of the input signal.

According to the present invention, the dynamic length of the electric power detecting circuit can be effectively utilized for finding the output electric power of the variable gain amplifier, and the input electric power of very low level can be accurately detected. Further, since the absolute value of the input electric power can be detected, the gain of the variable gain amplifier can be immediately set at its ideal value. Thus, in an apparatus such as a modem in which the output of its variable gain amplifier is converted into a digital signal applied to a digital signal processing circuit, a digital signal of required input level and also of stable digital level can be applied to the digital signal processing circuit.

Also, a microcomputer provided primarily for the purpose of signal processing can be used to provide the function of the circuit detecting the electric power and the circuit controlling the gain of the variable gain amplifier. Therefore, the construction of the apparatus would not become complex, and no hindrance to the desired high signal processing speed would be encountered.

DESCRIPTION OF THE PREFERRED EMBODIMENTS

Figure 1:
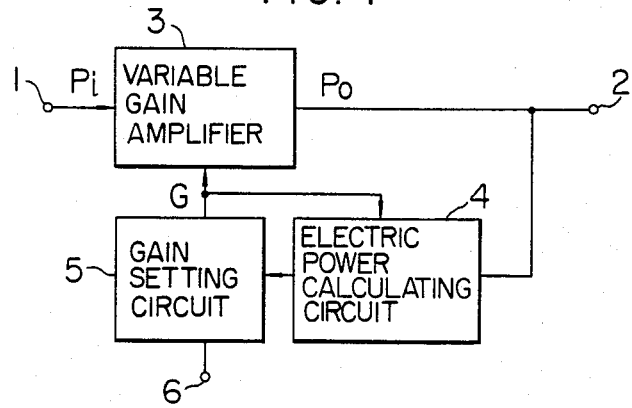
FIG. 1 is a block diagram showing the fundamental construction of the automatic gain control circuit according to the present invention.

Referring first to FIG. 1 showing the fundamental construction of the automatic gain control circuit according to the present invention, an input analogue signal is applied through an input terminal 1 to a variable gain amplifier 3 to be amplified with a predetermined amplification degree, and the output signal of the variable gain amplifier 3 is applied through an output terminal 2 to a signal processing circuit in an apparatus such as a modem (not shown). A portion of the output signal of the variable gain amplifier 3 is applied to an electric power calculating circuit 4 which calculates the electric power of its input. On the basis of the calculated electric power, a gain setting circuit 5 generates a required gain control signal which is applied to the variable gain amplifier 3. A portion of the gain control signal is applied to the electric power calculating circuit 4 to be used for the electric power calculation.

The input voltage, input resistance, output voltage, output resistance, input electric power, output electric power and amplifier gain are now designated by $$[mW] = \frac{V_o^2}{R_i} = \frac{(A' \cdot V_i)^2}{R_i},$$

and $A'$ respectively. Then, $P_i'$, $P_o'$ and $A'$ are expressed as follows:

$$P_i' = \frac{V_i^2}{R_i}$$

$$P_o' = \frac{V_o^2}{R_o} = \frac{V_o^2}{R_i} \qquad (1)$$

$$A' = \frac{V_o}{V_i}$$

The above values of $P_i'$, $P_o'$ and $A'$ are then represented in decibel as follows:

$$P_i = 10 \log \frac{P_i'}{1[mW]} \; [dBm]$$

$$P_o = 10 \log \frac{P_o'}{1[mW]} \; [dBm] \qquad (2)$$

$$A = 10 \log \frac{P_o'}{P_i'} = 20 \log A' \; [dB]$$

By the above transformation, $P_i$ is expressed as $$P_i = P_o - A \qquad (3)$$

Thus, the input electric power $P_i[dBm]$ can be detected from the gain $A[dB]$ and output electric power $P_o[dBm]$ of the variable gain amplifier 3.

Therefore, when it is desired to provide the required output electric power $P_o$ of level $P_{ref}$, the gain $A$ of the variable gain amplifier 3 can be calculated from the relation $P_{ref} - P_i = A$, where $P_i$ is the detected input electric power, and an amplified output signal of required electric power level $P_{ref}$ can be obtained by applying a required gain control signal from the gain setting circuit 5 to the variable gain amplifier 3.

Figure 2:
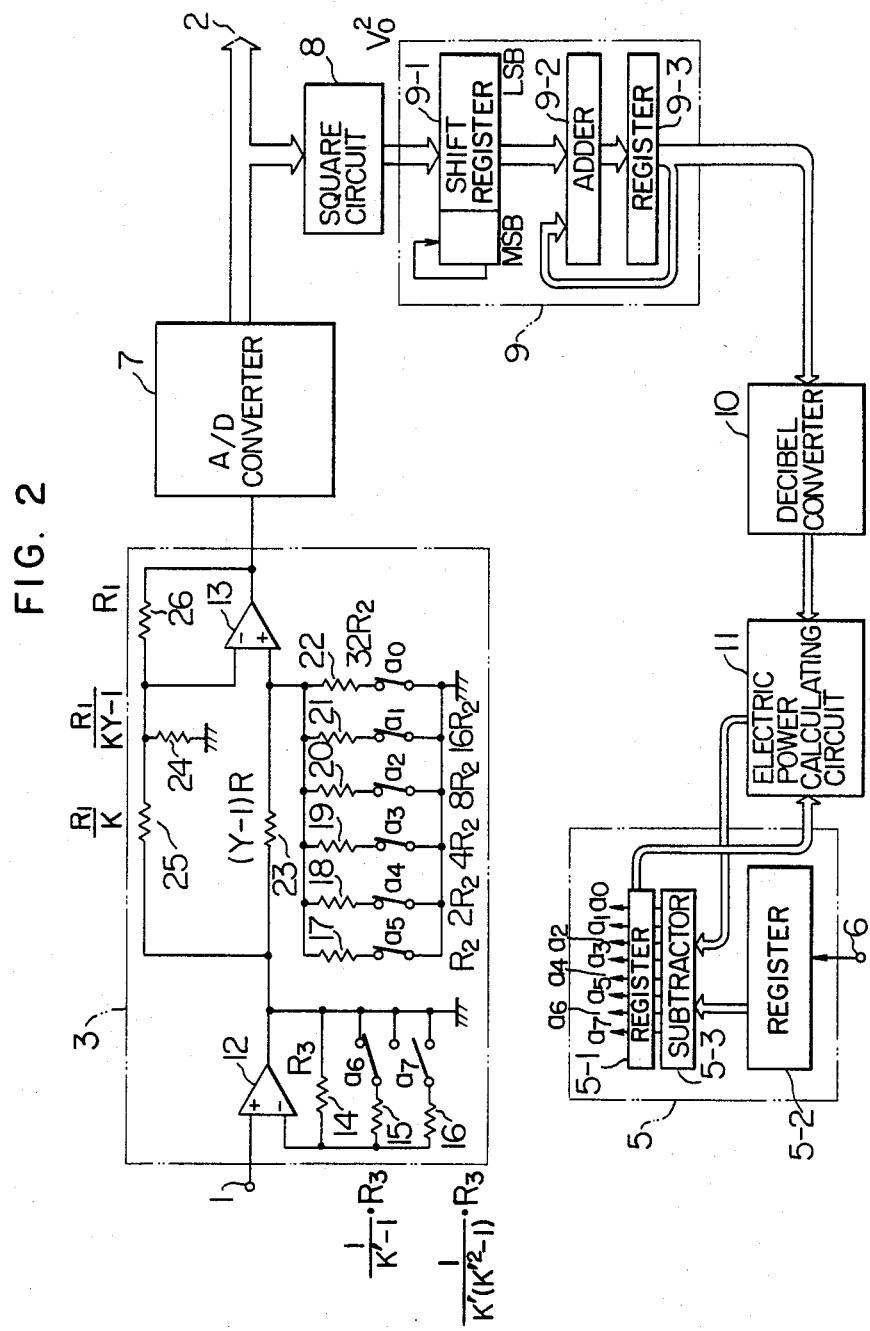

FIG. 2 is a detailed circuit diagram of an embodiment of the automatic gain control circuit of the present invention when the present invention is applied to a receiving part of a modem incorporated in a data transmission system. Referring to FIG. 2, a variable gain amplifier 3 is a circuit which amplifies an input signal $V_i$ applied to an input terminal 1. The amplified output signal $V_o$ from the variable gain amplifier 3 is converted into a digital signal by an analogue-to-digital (A/D) converter 7. A portion of the digital signal is applied through an output terminal 2 to a demodulating circuit (not shown) of the modem, and another portion of the digital signal is applied to a square circuit 8. The output signal of the square circuit 8 is applied to an averaging circuit 9 in which sampling data is averaged to be converted into a signal $P_o'$ indicative of the average electric power. The output signal $P_o'$ of the averaging circuit 9 is applied to a decibel converter 10 to be converted into a signal represented in decibel. This decibel converter 10 is provided for facilitating the design of an electric power calculating circuit 11 and a gain setting circuit 5 disposed in the succeeding stage. The electric power calculating circuit 11 calculates the input electric power $P_i$ on the basis of the decibel-represented output signal of the decibel converter 10 and the signal indicative of the gain of the variable gain amplifier 3, from the output signal of which the decibel-represented signal is derived. The gain setting circuit 5 is a circuit which generates the gain control signal applied to the variable gain amplifier 3.

The detailed structure and operation of the automatic gain control circuit will now be described. The variable gain amplifier 3 is composed of a left-hand amplifier part including an operational amplifier 12 and resistors 14, 15, 16 and a right-hand amplifier part including an operational amplifier 13 and resistors 17, 18, 19, 20, 21, 22, 23, 24, 25, 26. The plus terminal of the operational amplifier 12 in the left-hand amplifier part is coupled to the input signal, and the resistor 14 having a resistance value $R_3$ is connected across the output terminal and the minus terminal of the operational amplifier 12. The resistor 15 of a resistance value $$\frac{1}{K' - 1} \cdot R_3$$

($K'$: a constant) has one end connected to the minus terminal and the other end selectively connected to the output terminal of the operational amplifier 12 or to ground by being switched in response to a digital signal $a_6$, and the resistor 16 of a resistance value $$\frac{1}{K'(K'^2 - 1)} \cdot R_3$$

has one end connected to the minus terminal of the operational amplifier 12 and the other end selectively connected to ground by being switched in response to a digital signal $a_7$.

In the right-hand amplifier part, the resistor 23 having a resistance value $(Y-1)R$ ($Y$: a constant) is connected between the output terminal of the operational amplifier 12 and the plus terminal of the operational amplifier 13. The resistors 17, 18, 19, 20, 21 and 22 having resistance values $R_2$, $2R_2$, $4R_2$, $8R_2$, $16R_2$ and $32R_2$ respectively are selectively connected across the plus terminal of the operational amplifier 13 and ground by being switched in response to digital signals $a_5$, $a_4$, $a_3$, $a_2$, $a_1$ and $a_0$ respectively. The resistor 25 having a resistance value $R_1/K$ ($K$: a constant) is connected between the output terminal of the operational amplifier 12 and the minus terminal of the operational amplifier 13. The resistor 24 having a resistance value $$\frac{R_1}{KY - 1}$$

is connected across the minus terminal of the operational amplifier 13 and ground, and the resistor 26 having a resistance value $R_1$ is connected across the minus terminal and the output terminal of the operational amplifier 13.

In the left-hand amplifier part, the gain is controlled over four stages by the control signals $a_7$ and $a_6$ providing 2 bits, and, in the right-hand amplifier part, the gain is controlled over sixty-four stages by the control signals $a_5$ to $a_0$ providing 6 bits. The transfer function of the left-hand amplifier part is given by $$K' \cdot \frac{1 + a_7(K'^2 - 1)}{1 + \overline{a_6}(k' - 1)} \qquad (4)$$

where $a_6$ and $a_7$ are "1" or "0". Therefore, the transfer function takes one of the values 1, $K'$, $K'^2$ and $K'^3$ depending on the levels of the digital signals $a_7$ and $a_6$ so that the gain represented in decibel can be linearly varied.

On the other hand, the transfer function of the right-hand amplifier part is given by $$K \cdot \frac{Y - G(Y-1)}{1 + G(Y-1)} \quad (5)$$

Since $$\frac{G}{R} = \sum_{i=0}^{5} \overline{a_i} \frac{1}{2^{5-i} R_2} \quad (a_i: \text{``1'' or ``0''})$$

$$R = \frac{32}{63} R_2,$$

the following approximate expression (6) holds in the range in which Y is less than 1 neper:

$$K \cdot \frac{Y - G(Y-1)}{1 + G(Y-1)} \approx K \cdot Y^{(-2G+1)} \quad (6)$$

Thus, in the right-hand amplifier part, the gain represented in decibel can be linearly varied by linearly varying the level of the digital signals $a_5$ to $a_0$.

Therefore, in the variable gain amplifier 3 composed of these two amplifier parts, the gain represented in decibels can be varied in a relation linear, hence, being proportional with respect to the values of the digital signals $a_7$ to $a_0$.

It is apparent that the left-hand amplifier part may be unnecessary in some applications.

The output signal of the variable gain amplifier 3 is applied to the analogue-to-digital (A/D) converter 7. This A/D converter 7 is necessarily provided to meet the requirement for subsequent signal processing by a digital signal processing circuit. When for example, this A/D converter 7 is used with a data modem of 9,600 bps, the input signal is sampled at a sampling frequency of 9.6 kHz, and each sample is converted into a parallel data of 8 bits.

The output signal of the A/D converter 7 is applied to the modem from the output terminal 2, and, at the same time, a portion thereof is applied to the square circuit 8. This square circuit 8 may be a commonly known one, for example, the model MPY-8AJ produced by the TRW LSI PRODUCTS COMPANY. The 8-bit signal generated as a result of sampling is applied from the A/D converter 7 to the square circuit 8 to be turned into a 16-bit signal, and such an output signal is applied from the square circuit 8 to the averaging circuit 9. In the averaging circuit 9, the square data obtained by squaring a plurality of sampled data are added together, and the sum is then divided by the number of the added samples. However, the sum of the square data of the sampled data may exceed the capacity of the register. In the embodiment of the present invention shown in FIG. 2, in order to avoid the above trouble, the square data of each of the sampled data is divided by the number of added samples in a shift register 9-1. This is realized by shifting the square data by 3 bits in the low order direction when the number of added samples is 8. The output of the shift register 9-1 is added to the output of a 16-bit register 9-3 in an adder 9-2, and the resultant output of the adder 9-2 is applied to the 16-bit register 9-3.

Therefore, the output signal of the averaging circuit 9 is indicative of the average output electric power appearing from the variable gain amplifier 3. The output signal of the averaging circuit 9 is applied to the decibel converter 10 to be converted into a digital signal indicative of $$P_o = 10 \log \frac{P_o'[mW]}{1[mW]},$$

where $P_o'[mW]$ is the output of the averaging circuit 9. This decibel converter 10 includes a read-only memory (ROM), and the digital output signal of the averaging circuit 9 is applied as an address signal for reading out the corresponding decibel-converted signal recorded in the ROM.

Therefore, an output signal indicative of the digital data $P_{od}$ representing the value of $P_o$ given by $P_i + A = P_o$ appears from the decibel converter 10, when $P_i$ is the input electric power in dBm, and A is the gain of the variable gain amplifier 3 in dB.

The output signal indicative of the digital data $P_{od}$, which is representative of the value of $P_o$, is applied from the decibel converter 10 to the electric power calculating circuit 11. In this electric power calculating circuit 11, the digital data $A_d$ of the gain A[dB] of the variable gain amplifier 3 (determined by the digital signals $a_7$ to $a_0$) is substracted from the digital data Pod provided by the output signal of the decibel converter 10 to find the digital data $P_{id}$ of the input electric power $P_i$. Thus, the electric power calculating circuit 11 is in the form of a digital subtractor. The digital data $A_d$ of the gain A of the variable gain amplifier 3 is provided by a signal applied from a register 5-1 in the gain setting circuit 5 in which the gain control signal is recorded.

Thus, the calculation $P_{od} - A_d = P_{id}$ is executed in the electric power calculating circuit 11 so as to obtain the digital data $P_{id}$ of the input electric power $P_i$.

The circuits 11 and 5 can thus be used for the measurement of input electric power $P_i$ and can also be effectively used as a source of a control signal controlling the operation of the automatic gain control circuit as described later.

The A/D converter 7 is necessarily provided as shown in the embodiment of the present invention when a modem in a data transmission system is constructed for digital signal processing. In such a case, it is necessary to maintain constant the level of the output $P_o$ of the variable gain amplifier 3 so that the variable gain amplifier 3 may not generate an excessively large output resulting in a distortion or may not generate an excessively small output resulting in a degraded signal-to-noise (S/N) ratio. When it is desired to maintain constant the output electric power $P_o$ at the level of $P_{ref}$, the gain A of the variable gain amplifier 3 is preferably selected to satisfy the relation $$A = P_{ref} - P_i.$$

It is preferable, therefore, that a digital electric power data $P_{ref.d}$ corresponding to the electric power level $P_{ref}$ is stored in a register 5-2 of the gain setting circuit 5, and, at the time at which the input electric power $P_i$ is detected, the difference between the signal indicative of the data $P_{ref.d}$ read out from the register 5-2 and the signal indicative of the detected electric power data $P_{id}$ is calculated. A subtractor 5-3 provided for this purpose executed the calculation $P_{ref.d} - P_{id} = A_d$, and, on the basis of the calculated value of $A_d$, the corresponding ones of the digital signals $a_7$ to $a_0$ act to turn on-off the switches connected to the resistors 15 to 22 in the variable gain amplifier 3 so that the output electric power $P_o$ of the variable gain amplifier 3 can be instantaneously set at the level of $P_{ref}[dBm]$.

Figure 3:
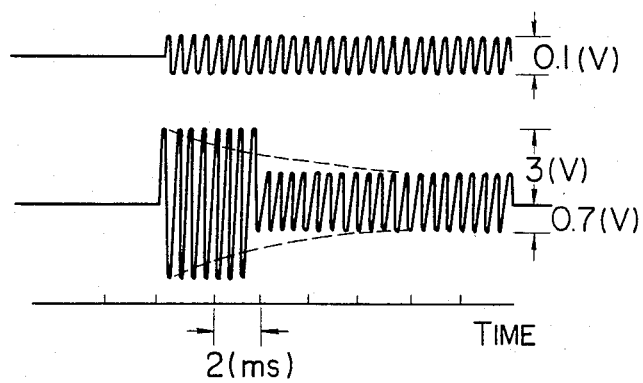
FIG. 3 shows input and output signal waveforms in the automatic gain control circuit shown in FIG. 1.

FIG. 3 is a sketch of photographs on which the response characteristic of the above-described embodiment of the automatic gain control circuit is displayed by an oscilloscope. In FIG. 3, the upper and lower waveforms represent the input and output signals respectively, and the output signal has a large amplitude in a portion in which the gain control is not effected and a small amplitude in a portion in which the gain control is sufficiently effective. It will be seen from FIG. 3 that the response to the gain control signal is very quick. The dotted envelope shown in FIG. 3 represents the response characteristic observed in the case of the prior art gain control.

FIGS. 4 to 7 are block diagrams of other preferred embodiments of the automatic gain control circuit according to the present invention. In FIGS. 4 to 7, the blocks designated by the same reference numerals are the same in function and structure.

Figure 4:
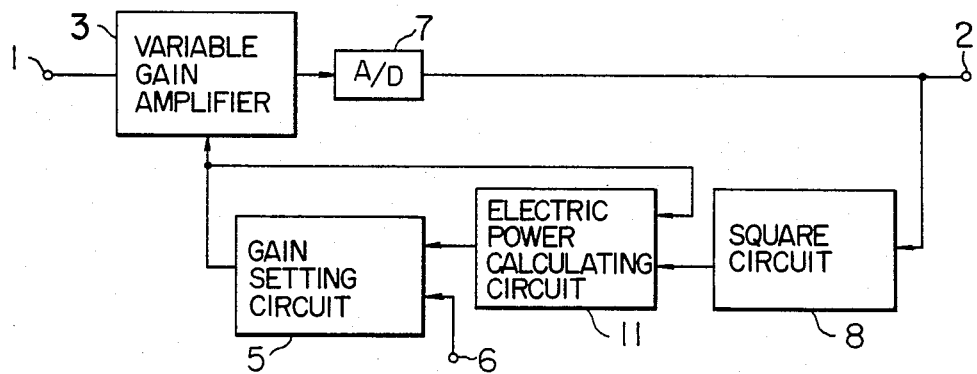
FIGS. 2, 4, 5, 6 and 7 show the construction of various preferred embodiments of the automatic gain control circuit according to the present invention respectively.
Figure 5:
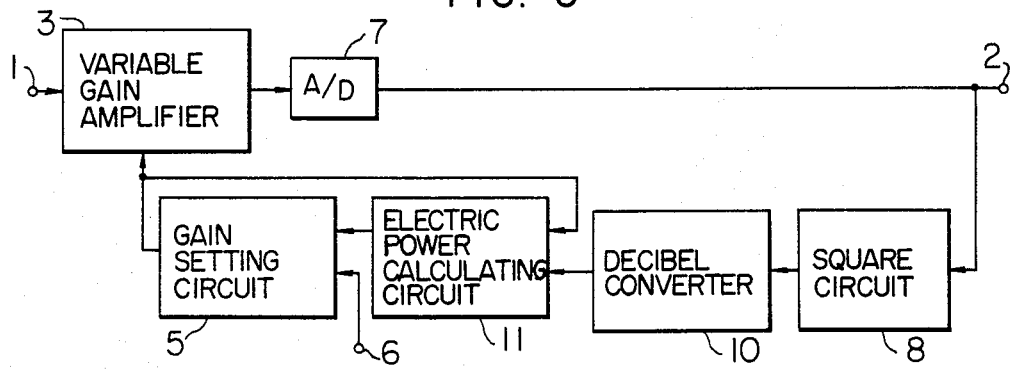
Figure 6:
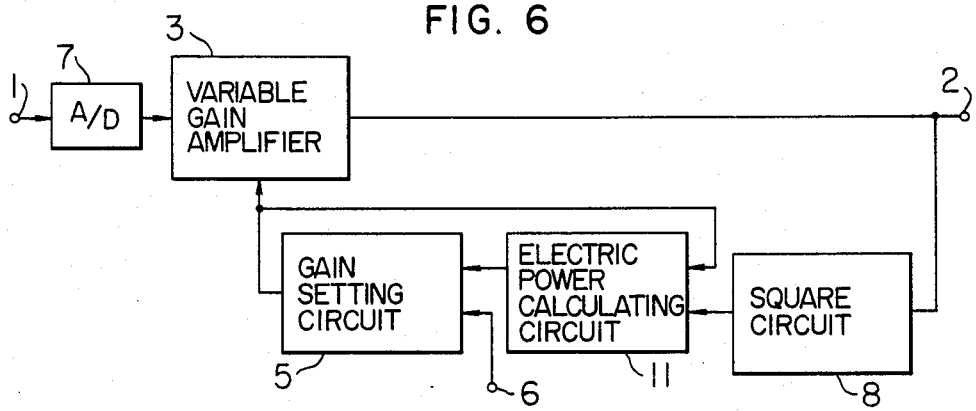

The embodiment shown in FIG. 4 is the simplest in construction in that it includes no averaging circuit 9 and no decibel converter. The embodiment shown in FIG. 5 is a modification of that shown in FIG. 4 in that the decibel converter 10 is additionally provided so as to simplify the calculation by and the structure of the gain setting circuit 5. The embodiment shown in FIG. 6 is also a modification of that shown in FIG. 4 in that the A/D converter 7 is disposed in the stage preceding the variable gain amplifier 3 and that the variable gain amplifier 3 includes a digital circuit. In the embodiments shown in FIGS. 4 to 6, the instantaneous value of the input electric power is calculated for the gain control of the automatic gain control circuit. In contrast, in the embodiment shown in FIG. 7, the averaging circuit 9 is additionally provided so as to attain the gain control of the automatic gain control circuit on the basis of the time-based average of the instantaneous values of the input electric power.

Figure 7:
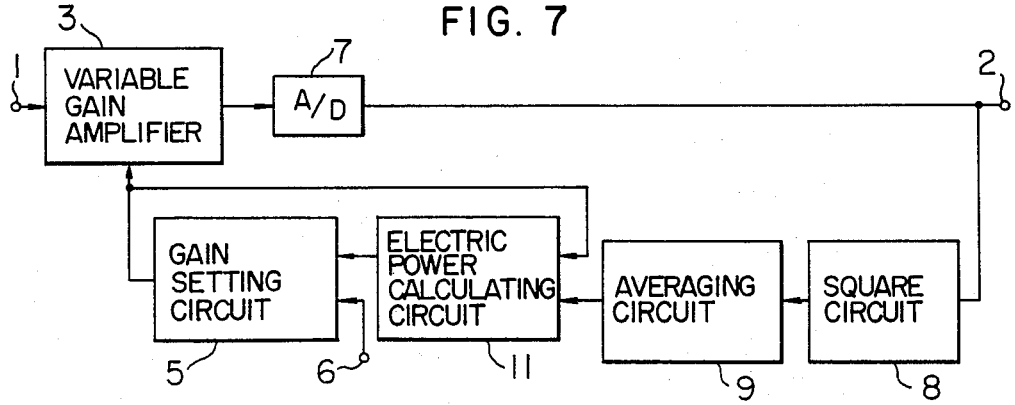

This averaging circuit 9 may also be incorporated in the embodiments shown in FIGS. 5 and 6, besides that shown in FIG. 7. Further, in lieu of disposing the averaging circuit 9 in the stage succeeding the square circuit 8, the averaging circuit 9 may alternatively be disposed in the stage succeeding the electric power calculating circuit 11 or in the stages succeeding both of these circuits 8 and 11.

While a plurality of embodiments of the present invention have been described by way of example, the present invention is in no way limited to such specific embodiments. It is apparent that, although the circuits such as the square circuit, averaging circuit, decibel converter, electric power calculating circuit and gain setting circuit are independently provided to serve their individual purposes, they may be combined with a signal processing system including a signal processing apparatus such as a microcomputer or any other digital signal processing system.

We claim:
1. A gain control circuit comprising:
a variable gain amplifier,
a measuring circuit for detecting output electric power of said variable gain amplifier,
a gain setting circuit coupled to the variable gain amplifier for generating a gain control signal controlling the gain of the variable gain amplifier, and
a calculating circuit coupled to the output of the measuring circuit and to the output of the gain setting circuit for detecting input electric power of said variable gain amplifier on the basis of said gain control signal and the output signal of said measuring circuit,
said gain setting circuit being controlled by an output of said calculating circuit to adjust said gain control signal in order to settle the output electric power of said variable gain amplifier to a predetermined value on the basis of the output signal of said calculating circuit and said predetermined value.

2. A gain control circuit as claimed in claim 1 wherein the output signal of said variable gain amplifier used by said calculating circuit for detecting input power comprises an output power signal $P_o'$ determined by $P_o' = V_o^2/R_o$ where $V_o$ is an output voltage of the variable gain amplifier and $R_o$ is an output resistance of the variable gain amplifier.

3. A gain control circuit as claimed in claim 2 further comprising means for converting the output power of the variable gain amplifier into decibels and means for converting the gain control signal into decibels, and wherein said calculating circuit comprises means for subtracting the decibel value of the gain control signal from the decibel value of the output power signal to determine the input power to the variable gain amplifier.

4. A gain control circuit as claimed in claim 1, wherein said measuring circuit includes an A/D converter for effecting analogue-to-digital conversion of the output signal of said variable gain amplifier, a square circuit for squaring an output signal of said A/D converter, and an averaging circuit for averaging an output signal of said square circuit.

5. A gain control circuit as claimed in claim 4, wherein said calculating circuit includes a decibel converter for converting an output signal of said averaging circuit into a signal in decibel, and said calculating circuit includes a circuit for subtracting the output signal of said gain setting circuit from an output signal of said decibel converter to determine said input electric power to the variable gain amplifier, said gain control signal for said variable gain amplifier being provided by subtracting the output signal of said calculating circuit from an electric power signal indicative of a predetermined power level to be selected as output electric power of said variable gain amplifier.

6. A gain control circuit as claimed in claim 1, wherein said calculating circuit includes a decibel converter for converting an output signal of said measuring circuit into a signal in decibel, and said calculating circuit includes a circuit for subtracting the output signal of said gain setting circuit from an output signal of said decibel converter to determine said input electric power to the variable gain amplifier, said gain control signal for said variable gain amplifier being provided by subtracting the output signal of said calculating circuit from an electric power signal indicative of a predetermined power level to be selected as output electric power of said variable gain amplifier.

7. A gain control circuit as claimed in claim 1, further comprising means for converting the output power of the variable gain amplifier into decibels and means for converting the gain control signal into decibels, and wherein said calculating circuit comprises means for subtracting the decibel value of the gain control signal from the decibel value of the output power signal to determine the input power to the variable gain amplifier.

* * * * *